United States Patent
Kurihara

(10) Patent No.: US 7,808,234 B2
(45) Date of Patent: Oct. 5, 2010

(54) ROTATIONAL ANGLE DETECTION DEVICE WITH A ROTATING MAGNET AND A FOUR-POLE AUXIILIARY MAGNET

(75) Inventor: Takeo Kurihara, Minato-ku (JP)

(73) Assignee: Tomen Electronics Corporation, Tokyo (JP)

( * ) Notice: Subject to any disclaimer, the term of this patent is extended or adjusted under 35 U.S.C. 154(b) by 361 days.

(21) Appl. No.: 11/988,215

(22) PCT Filed: Jul. 14, 2006

(86) PCT No.: PCT/JP2006/314034

§ 371 (c)(1),
(2), (4) Date: Jan. 3, 2008

(87) PCT Pub. No.: WO2007/010842

PCT Pub. Date: Jan. 25, 2007

(65) Prior Publication Data

US 2009/0033321 A1 Feb. 5, 2009

(30) Foreign Application Priority Data

Jul. 20, 2005 (JP) .............................. 2005-209396

(51) Int. Cl.
*G01B 7/30* (2006.01)
(52) U.S. Cl. .............................. 324/207.25; 324/207.21
(58) Field of Classification Search .................. None
See application file for complete search history.

(56) References Cited

U.S. PATENT DOCUMENTS

| | | | | |
|---|---|---|---|---|
| 6,326,781 | B1 * | 12/2001 | Kunde et al. ............ | 324/207.21 |
| 2002/0089327 | A1 * | 7/2002 | Spellman ................ | 324/207.21 |
| 2004/0012385 | A1 | 1/2004 | Kirkpatrick, II | |
| 2004/0095131 | A1 * | 5/2004 | Withanawasam et al. ..................... | 324/207.21 |

FOREIGN PATENT DOCUMENTS

| | | |
|---|---|---|
| JP | A-7-260414 | 10/1995 |
| JP | A-11-94512 | 4/1999 |
| JP | A-2003-4480 | 1/2003 |
| JP | A-2005-24282 | 1/2005 |
| WO | WO 2004/113928 A2 | 12/2004 |

* cited by examiner

*Primary Examiner*—Jay M Patidar
(74) *Attorney, Agent, or Firm*—Oliff & Berridge, PLC

(57) ABSTRACT

A rotational angle detection device enables rotational angle detection for rotational angles ranging from 0° to 360° with an extremely simple configuration. The rotational angle detection device includes: a rotating magnet 12, which is mounted on one end of a rotating shaft 11; a four-pole auxiliary magnet 14, which is mounted on a substrate 13 opposed to the rotating magnet 12 without contact; and a magnetic sensor 15, which is mounted on the opposite side of the substrate 13. The four-pole auxiliary magnet 14 converts one rotating magnetic field of 0° to 360° provided by the rotating magnet 12 in a region where the magnetic sensor 15 is positioned into another rotating magnetic field of 0° to 180°.

5 Claims, 7 Drawing Sheets (a) θ = 0°

(b) θ = 90°

(c) θ = 180°

(d) θ = 270°

ROTATIONAL ANGLE DETECTION DEVICE WITH A ROTATING MAGNET AND A FOUR-POLE AUXIILIARY MAGNET

TECHNICAL FIELD

The present invention relates to a rotational angle detection device, which uses a magnetic sensor with bridge-connected magnetoresistive effect elements (hereinafter, referred to as "MR elements") to detect a rotational angle of a detection object.

BACKGROUND ART

A rotational angle detection device of non-contact type using an MR sensor is known that is used to detect a rotational angle of a rotating shaft as a detection object, as disclosed in, e.g., Patent Document 1.

Here, a conventional rotational angle detection device of this type will be described below with reference to FIGS. 9 and 10.

As illustrated in FIG. 9, a rotational angle detection device comprises: a rotating magnet 102, which is attached to a rotating shaft 101 as a detection object and rotated with the rotating shaft 101; and a magnetic sensor 103, which is positioned in the vicinity of the rotating magnet 102, without contacting with the rotating shaft 101.

The magnetic sensor 103 comprises a pair of sensor units 121 and 122, each with bridge-connected four MR elements 111, respectively, as illustrated in FIG. 10, etc. Each of the four MR elements 111 that configure each of the sensor units 121 and 122 have magnetic anisotropy as their physical attribute, respectively. That is, the MR elements 111 provide different resistance values in magnetic fields along a easy-magnetization axis from those in magnetic fields along a difficult-magnetization axis perpendicular to the easy-magnetization axis.

The four MR elements 111 that configure the sensor units 121 or 122 are positioned in such a way that their easy-magnetization axes are displaced by an angle of 90° with respect to each other. In addition, each MR element 111 in the sensor unit 121 and each MR element 111 in the sensor unit 122 are positioned in such a way that their easy-magnetization axis are tilted by an angle of 45° with respect to each other. The magnetic sensor 103 is positioned in a homogeneous magnetic field of the rotating magnet 102 on a substrate 104.

In this rotational angle detection device, as the rotating shaft 101 rotates, the rotating magnet 102, which is attached to the rotating shaft 101, rotates accordingly, thereby providing a rotating magnetic field in the magnetic sensor 103. This would cause a change in resistance of each MR element 111 and change values of current, flowing through the bridge, to have a sinusoidal shape. Hence, the magnetic sensor 103 outputs a sinusoidal signal. A rotational angle of the rotating shaft 101 can be detected from that sinusoidal signal.

However, since the above-mentioned magnetic sensor 103, by its nature, has only an detectable angle range of 180°, from one easy-magnetization axis at the plus-end to the other easy-magnetization axis at the minus-end, it could not univocally detect an angle ranging from 0° to 360°.

For this purpose, a technology is known in the art that enables a rotational angle detection ranging from 0° to 360°, for example, by positioning a hall element in the vicinity of the magnetic sensor (as disclosed in Patent Document 2).

In addition, an angle sensor using a permanent magnet is known in the art as a device for reinforcing magnetic anisotropy in the magnetic sensor (as disclosed in Patent Document 3).

[Patent Document 1] Japanese Patent Laid-Open No. (HEI) 7-260414

[Patent Document 2] Japanese Patent Laid-Open No. (HEI) 11-94512

[Patent Document 3] Japanese Patent Laid-Open No. 2003-4480

DISCLOSURE OF THE INVENTION

However, for the device disclosed in Patent Document 2, a problem arises that would complicate processing circuitry since a hall element must be provided in addition to the magnetic sensor and signal processing must be provided for both the hall element and the magnetic sensor. In addition, Patent Document 3 does not disclose any relationship in detail for rotational angles of rotating magnets.

The present invention is provided in view of the above problem. An object of the present invention is to provide a rotational angle detection device that may detect rotational angle ranging from 0° to 360° with an extremely simple configuration.

A rotational angle detection device according to the present invention comprises: a rotating magnet attached to a detection object and rotated with the detection object to generate a rotating magnetic field; a magnetic sensor positioned in a rotating magnetic field generated by the rotating magnet to position sensor units with bridge-connected magnetic resistive effect elements in such a way that their easy-magnetization axis are displaced by an angle of 45°; and a four-pole auxiliary magnet positioned in the vicinity of the magnetic sensor to generate a combined rotating magnetic field ranging from 0° to 180°, from a rotating magnetic field ranging from 0° to 360° provided by the rotating magnet in a region where the magnetic sensor is positioned.

In a preferred embodiment of the present invention, the magnitude of a magnetic moment of the rotating magnet and a synthesized magnetic moment of the four-pole auxiliary magnet, each being provided to the magnetic sensor, is substantially the same.

The four-pole auxiliary magnet is, e.g., a ring-shaped magnet that is positioned in parallel to a rotating surface of the rotating magnet. In addition, in a preferred embodiment, the four-pole auxiliary magnet is coaxially positioned with respect to a rotating shaft of the rotating magnet; and the magnetic sensor is positioned in a homogeneous magnetic field of the four-pole auxiliary magnet. Further, in another embodiment, the four-pole magnet is positioned in a displaced position with respect to the rotating shaft and on the same surface as a rotating surface of the rotating magnet; and the magnetic sensor is positioned in the homogeneous magnetic field of the four-pole magnet.

ADVANTAGE(S) OF THE INVENTION

According to the present invention, since a four-pole auxiliary magnet is provided in the vicinity of a magnetic sensor, a synthesized magnetic moment between a synthesized magnetic moment of the four-pole auxiliary magnet and a magnetic moment obtained from a rotating magnet serves to convert a rotational angle ranging from 0° to 360° provided by the rotating magnet into a rotational angle ranging from 0° to 180°. This enables a detected value for a rotational angle between 0° and 180° at the magnetic sensor to be obtained as a detected value for a rotational angle between 0° and 360° for the detection object.

In accordance with the present invention, conventional circuits for signal processing can be used without change by merely adding an additional four-pole auxiliary magnet.

PREFERRED EMBODIMENTS OF THE INVENTION

Embodiments of the present invention will now be described below with reference to the accompanying drawings.

First Embodiment

Figure 1:
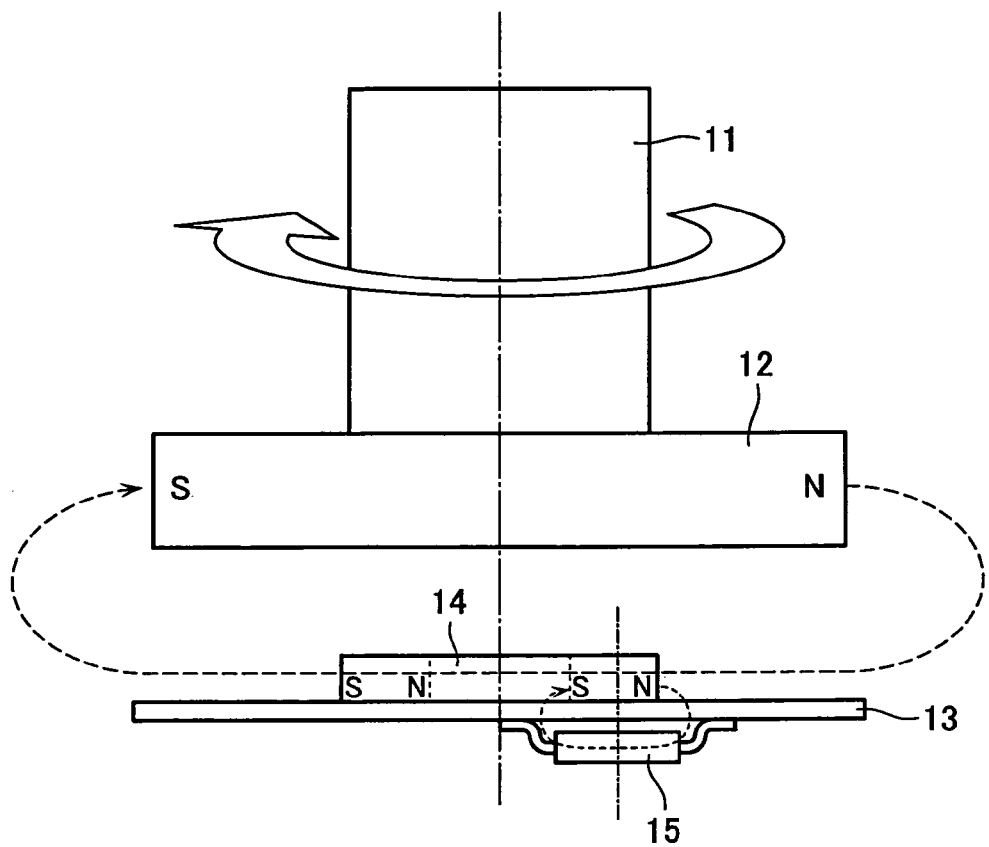
FIG. 1 is a side view illustrating a configuration of a rotational angle detection device according to a first embodiment of the present invention.
Figure 2:
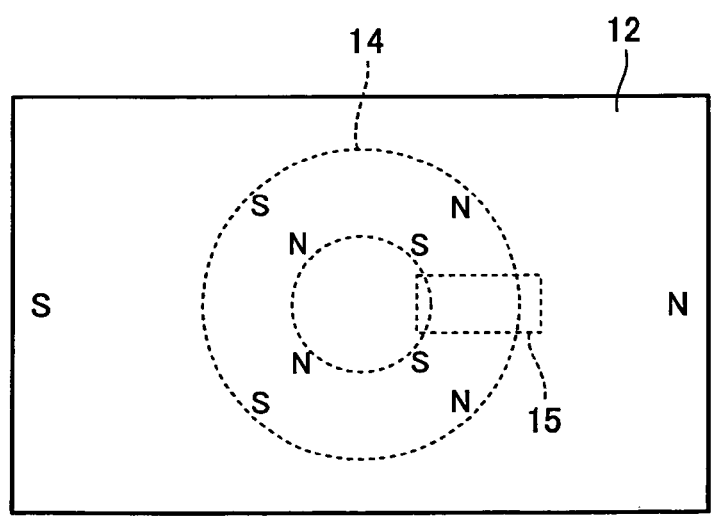
FIG. 2 is a simplified plan view of the device of FIG. 1.

FIG. 1 is a side view illustrating a configuration of a rotational angle detection device according to a first embodiment of the present invention; and FIG. 2 is a plan view of the same device. The rotational angle detection device comprises: a rotating magnet 12, which is mounted on one end of a rotating shaft 11 as a detection object; a four-pole auxiliary magnet 14, which is mounted on a substrate 13 opposed to the rotating magnet 12 without contact; and a magnetic sensor 15, which is mounted on the opposite side of the substrate 13.

Figure 10:
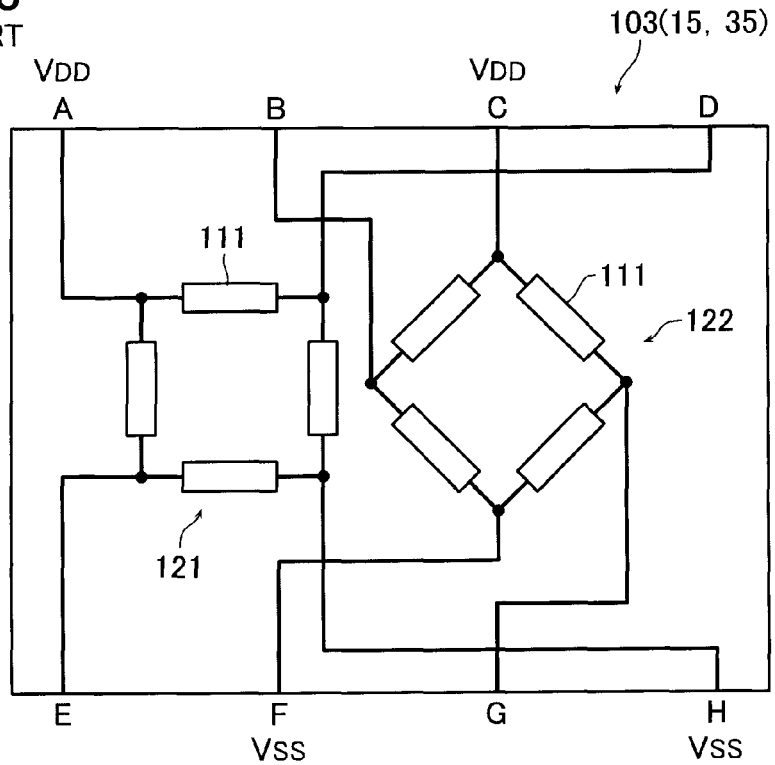
FIG. 10 is a circuit diagram illustrating details of the magnetic sensor.

The detection object is the rotating shaft 11 of a motor or the like. In this first embodiment, shaft ends of the rotating shaft 11 can be used as a detection object. The rotating magnet 12, which has a shape of rectangular parallelepiped, is a two-pole permanent magnet with its poles being provided at both ends in its longitudinal direction. The four-pole auxiliary magnet 14 is a ring-shaped magnet that is coaxially positioned with respect to the rotating shaft 11. Additionally, in FIG. 2, the four-pole auxiliary magnet 14 is magnetized so as to form a magnetic moment in a direction of +45° and −45° with respect to the horizontal center line. The magnetic sensor 15, which is similar to that in FIG. 10, is mounted on a displaced position with respect to the rotational center so that it would be positioned in a homogeneous magnetic field generated by the rotating magnet 12 and the four-pole auxiliary magnet 14.

Figure 3:
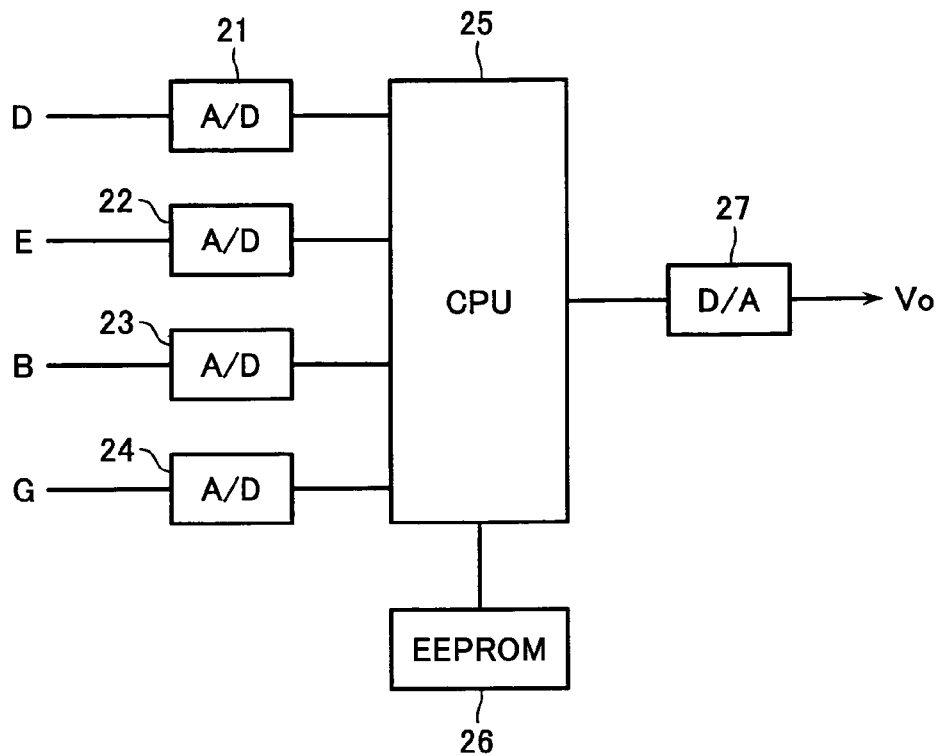
FIG. 3 is a block diagram illustrating a circuit configuration of the device of FIG. 1.

FIG. 3 illustrates a signal processing circuit connected to the magnetic sensor 15. Each detected signal that is output from each output terminal D, E, B and G of the magnetic sensor 15 is subject to A/D conversion at A/D conversion circuits 21 to 24, and then input to a CPU 25. Then, the CPU 25 performs a certain signal processing according to a program stored in an EEPROM 26 and calculates rotational angle detection data. Finally, the detected data is converted into an analog signal by a D/A conversion circuit 27 and output as a rotational angle detection signal Vo.

Next, there will be described principles of detection in the angle detection device so configured, according to the first embodiment.

Figure 4:
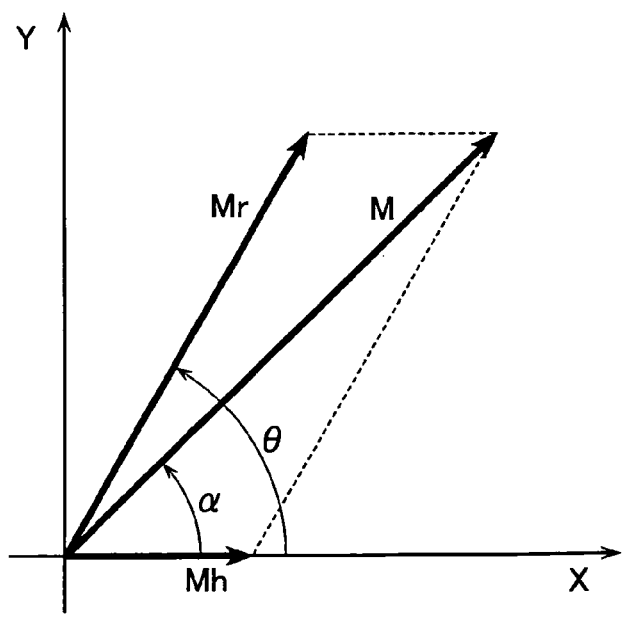
FIG. 4 is a vector diagram for illustrating the principles for detecting rotational angles of the device of FIG. 1.

FIG. 4 illustrates a relationship between values Mr, Mh, M, θ and α, wherein the X axis represents a horizontal direction in FIG. 2; the Y-axis represents a vertical direction; Mr represents a magnetic moment of the rotating magnet 12; Mh represents a synthesized magnetic moment of the four-pole auxiliary magnet 14; M represents a synthesized magnetic moment of Mr and Mh; and "θ" and α represents a rotational angle of each magnetic moment Mr and M, respectively. Between these, the following relationship is obtained:

$$M \cos \alpha = Mh + Mr \cos \theta \quad (1)$$

$$M \sin \alpha = Mr \sin \theta \quad (2)$$

Provided that Mr=Mh, the formula (1) is given as follows:

$$M\cos\alpha = Mr(1 + \cos\theta) \quad (3)$$
$$= Mr\{(2\cos(\theta/2) * \cos(-\theta/2)\}$$

Similarly, the formula (2) is given as follows:

$$M \sin \alpha = Mr\{(2 \sin(\theta/2) * \cos(-\theta/2)\} \quad (4)$$

Then, the result of (4)/(3) is given as follows:

$$\tan\alpha = \sin(\theta/2)/\cos(\theta/2) \quad (5)$$
$$= \tan(\theta/2)$$

Thus, α=θ/2 is obtained. That is, if a magnetic moment Mr of the rotating magnet 12 is equal to the synthesized magnetic moment Mh of the four-pole auxiliary magnet 14, a rotational angle α of the synthesized magnetic moment M would become just half of a rotational angle θ of the rotating magnet 12, and the synthesized magnetic moment M would vary within the range of 0° to 180° for rotations of 0° to 360° provided by the rotating magnet 12.

FIGS. 5(a) to 5(d) illustrate those variations in a synthesized magnetic moment M that affect the magnetic sensor 15 when the rotating magnet 12 sequentially rotates to 0°, 90°, 180° and 270°, each angle corresponding to a rotational angle θ of the rotating magnet 12 in these drawings.

Figure 6:
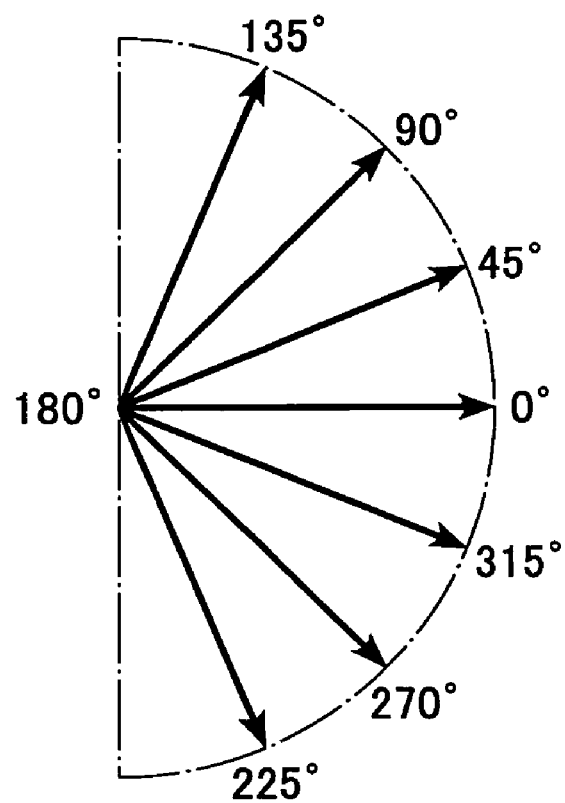
FIG. 6 is a vector diagram for illustrating operation of the device of FIG. 1.

The synthesized magnetic moment Mh of the four-pole auxiliary magnet 14 is fixed to 0°. Accordingly, when a rotational angle θ of the rotating magnet 12 changes among 0°, 90°, and 270° (−90°), the synthesized magnetic moment M also changes among 0°, 45°, and −45°. However, when θ is equal to 180°, M=0. Accordingly, as illustrated in FIG. 6, the synthesized magnetic moment M would change within the range of 0° to 180°, from 0° to 90° and from −90° to 0°, for rotations of 0° to 360° of the rotating magnet 12. Therefore, by detecting those changes by the magnetic sensor 15, changes in rotational angle of the rotating shaft 11 can be detected within the range of 0° to 360°.

Next, calibration procedures for obtaining Mh=Mr will be described below.

(Step 1) First, the magnetic sensor 15 and the four-pole auxiliary magnet 14 are positioned in such a way that their reference axis forms an angle of 0°. For this purpose, the following steps 1a and 1b are performed.

(Step 1a) The magnetic sensor 15 and the signal processing circuit are positioned in a marked position in the lower surface of the substrate 13 so that the angle between the reference axes of the substrate 13 and the magnetic sensor 15 is 0°.

(Step 1b) Offsets are calibrated while monitoring an output signal Vo from the signal processing circuit, with an oscilloscope or the like. Then, the four-pole auxiliary magnet 14 is positioned in a marked position in the upper surface of the substrate 13 (on the side of the rotating magnet 12) so that the output signal Vo becomes a value indicating 0° as being read by a digital multi-meter.

Figure 5:
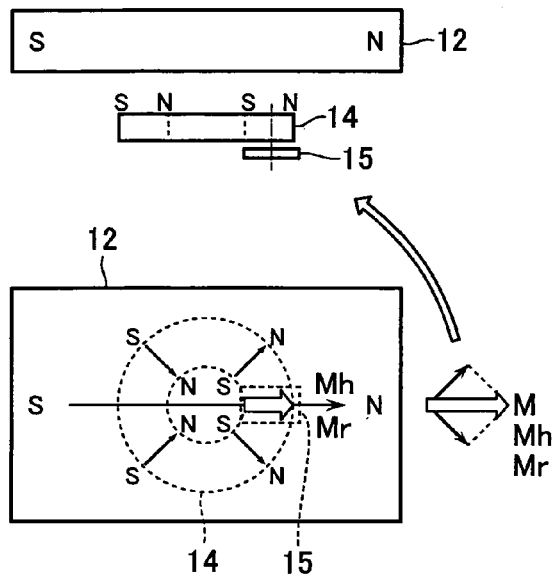
FIG. 5 is a side view and a plan view for illustrating operation of the device of FIG. 1.
Figure 5:
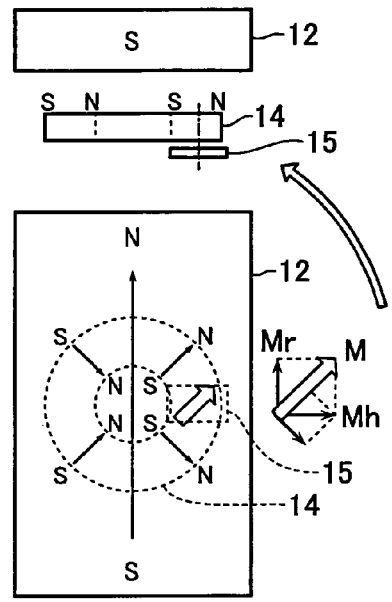
Figure 5:
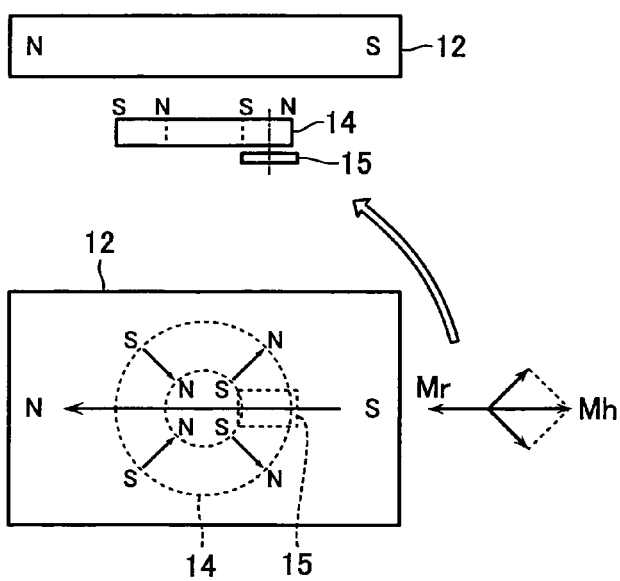
Figure 5:
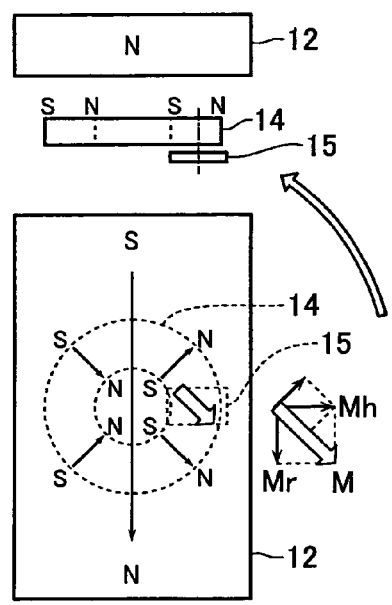

(Step 2) Next, the rotating magnet 12 and the four-pole auxiliary magnet 14 are positioned in such a way that their magnetic moments Mh and Mr are orthogonal to each other (so as to have a relationship as illustrated in FIG. 5(b)). For this purpose, the following steps 2a and 2b are performed.

(Step 2a) Based on 0° that was determined at step 1, and similar to step 1b, the rotating magnet 12 is located so that the output signal Vo from the signal processing circuit becomes a value indicating 0° as being read by the digital multimeter. This position is regarded as a reference position 0° of the rotating magnet 12.

(Step 2b) In order to rotate the rotating magnet 12 by 90° with respect to the reference position 0° of the rotating magnet 12 that was determined at step 2a, for example, an absolute encoder (e.g., MAR-M30 manufactured by Nikon Corporation or its equivalent) is used. This encoder has a resolution of 131,072 (=$2^{17}$) pulses/revolution (angle per pulse=0.0027°). Thereby, it is possible to set an angle in such a way that the rotating magnet 12 is oriented within 90.00°±0.01°, with an accuracy of at least 0.01°.

(Step 3) Based on the position of the rotating magnet 12 that was determined at step 2, and similar to step 2a, the output signal Vo from the signal processing circuit is read by a digital multi-meter while monitoring it with an oscilloscope. Then, the read value for the above-mentioned 0° is subtracted from the read value to obtain a compensation angle value (α).

In turn, the CPU 25 determines whether the output from the magnetic sensor 15 shows α=45°, i.e., Mr=Mh. If Mr=Mh, then the calibration process is terminated. If Mr≠Mh, i.e., α≠45°, the following relationship is established.

$$Mr = \tan \alpha * Mh \quad (6).$$

In a word, the following relationship is established.

$$Mh * \tan \alpha = Mr.$$

Herein, tan α is referred to as a "compensation coefficient".

Second Embodiment

Figure 7:
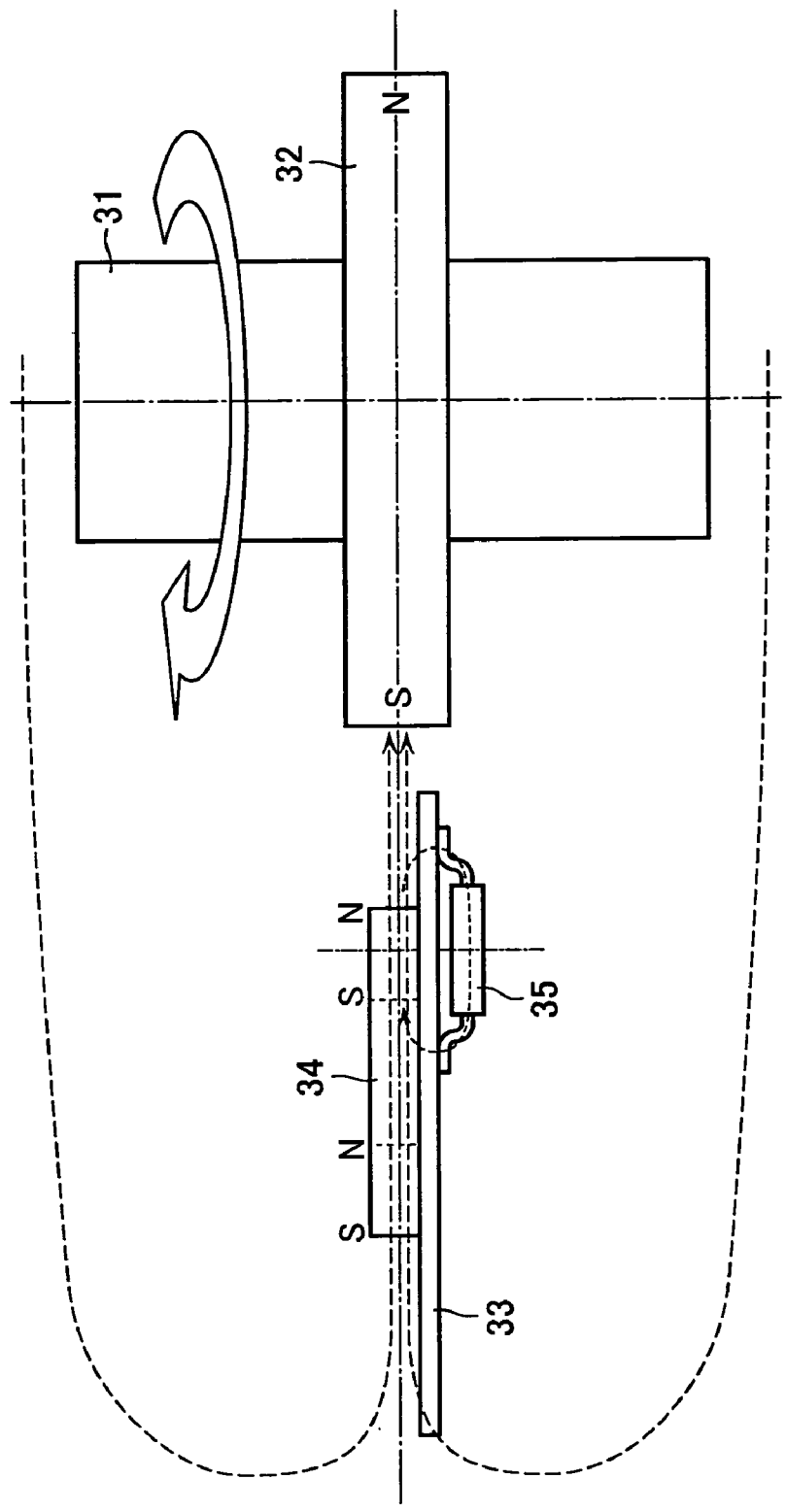
FIG. 7 is a side view illustrating a configuration of a rotational angle detection device according to a second embodiment of the present invention.
Figure 8:
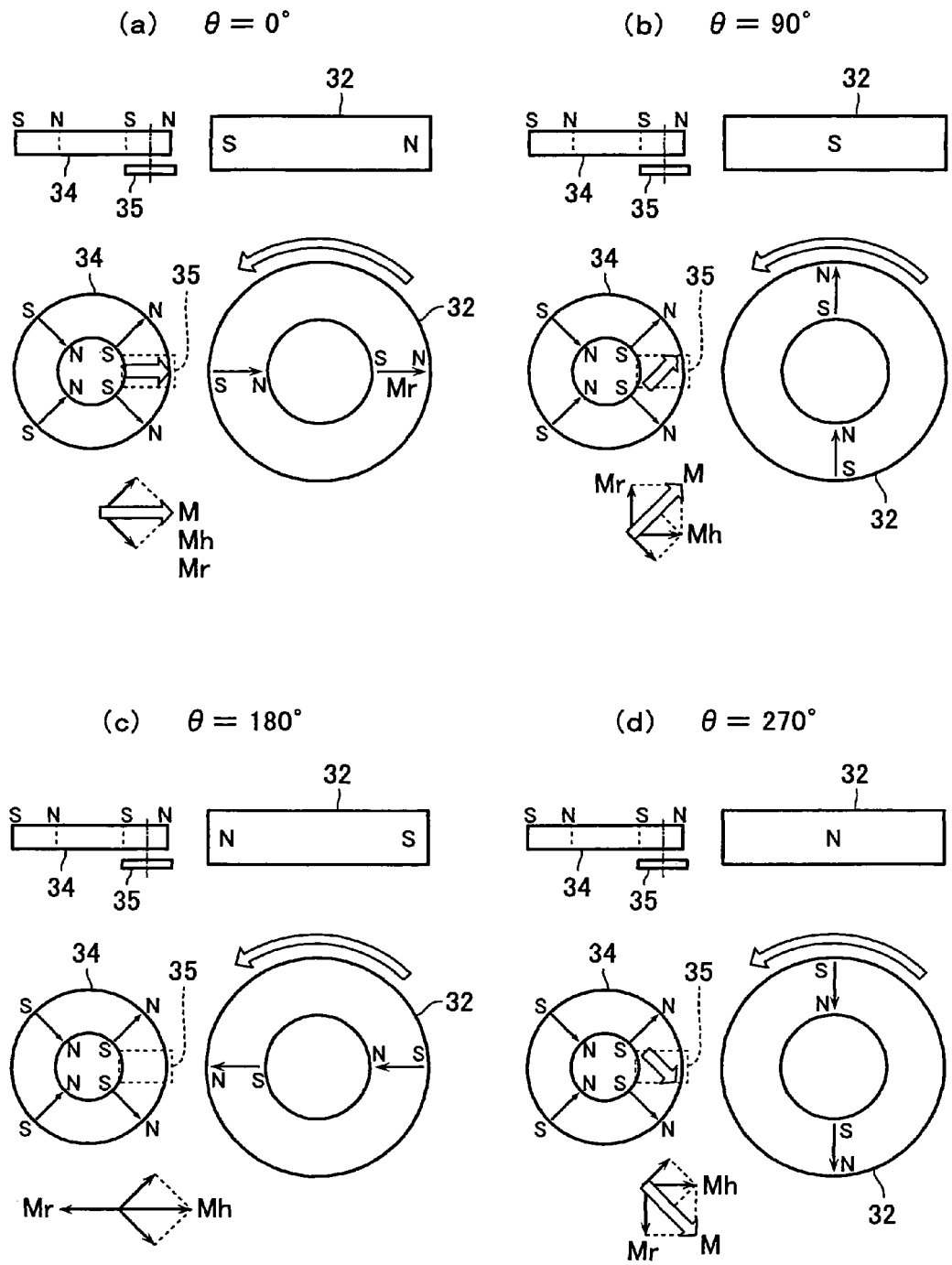
FIG. 8 is a side view and a plan view for illustrating operation of the device of FIG. 7.
Figure 9:
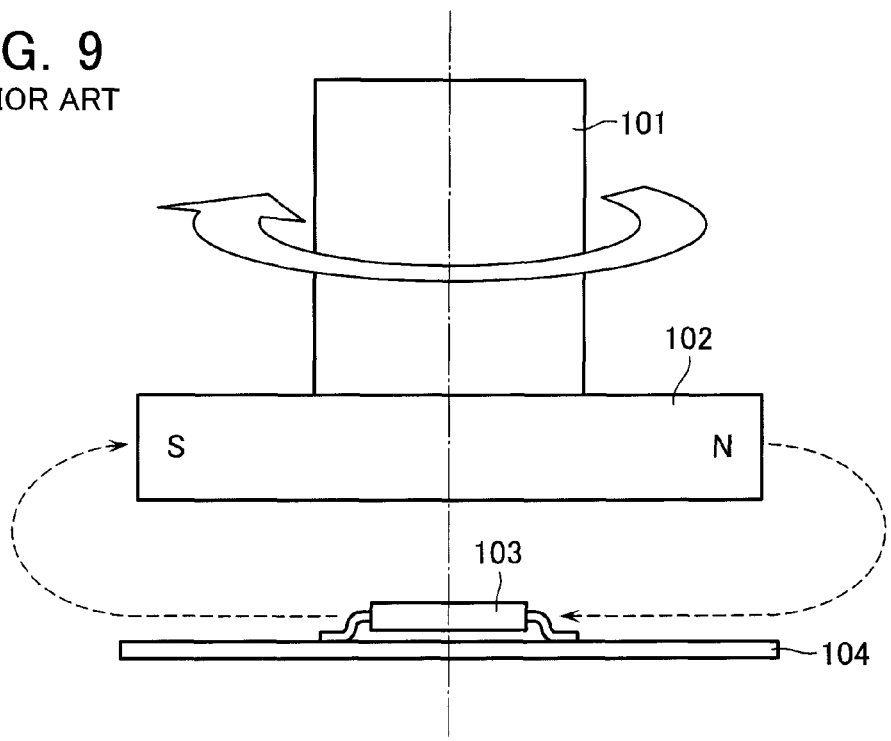
FIG. 9 is a side view illustrating a configuration of a conventional rotational angle detection device.

FIG. 7 is a side view illustrating a configuration of a rotational angle detection device according to a second embodiment of the present invention. This embodiment is suitable for a case where such shaft ends may not be available because a steering angle of an automobile is detected from a shaft rotational angle of an assisting electric motor.

A rotating shaft 31 as the detection object is equipped with a ring-shaped rotating magnet 32. A ring-shaped four-pole auxiliary magnet 34 is mounted on a substrate 33 that is positioned on the same surface as the rotating surface of the rotating magnet 32. In addition, a magnetic sensor 35 is mounted on the rear surface of the substrate 33. The magnetic sensor 35, which is similar to that in FIG. 10, is mounted on a displaced position with respect to the center of the four-pole auxiliary magnet 34 so that it would be positioned in a homogenous magnetic field generated by the four-pole auxiliary magnet 34.

In addition, in this embodiment, and as illustrated in FIGS. 8(a) to 8(d), the synthesized magnetic moment M would vary within the range of 0° to 180°, from 0° to 90° and from −90° to 0°, for rotations of 0° to 360° provided by the rotating magnet 32. Therefore, by detecting those changes by the magnetic sensor 35, changes in rotational angle of the rotating shaft 31 can be detected within the range of 0° to 360°.

Although an annular permanent magnet has been used as a four-pole auxiliary magnet in the above description, the four-pole auxiliary magnet is not necessarily limited to have an annular shape. For example, an elliptic magnet also can be used for the four-pole auxiliary magnet. In this case, four-pole magnetization can be performed in a symmetric direction to the short or long axis.

The invention claimed is:

1. A rotational angle detection device comprising:
    a rotating magnet attached to a detection object and rotated with the detection object to generate a rotating magnetic field;
    a magnetic sensor positioned in a rotating magnetic field generated by the rotating magnet to position sensor units with bridge-connected magnetoresistive effect elements in such a way that their easy-magnetization axis are displaced by an angle of 45°; and
    a four-pole auxiliary magnet positioned in the vicinity of the magnetic sensor to generate a synthesized rotating magnetic field ranging from 0° to 180°, from a rotating magnetic field ranging from 0° to 360° provided by the rotating magnet
    in a region where the magnetic sensor is positioned.

2. The rotational angle detection device according to claim 1, wherein
    the magnitude of a magnetic moment of the rotating magnet and a synthesized magnetic moment of the four-pole auxiliary magnet, each being provided to the magnetic sensor, is substantially the same.

3. The rotational angle detection device according to claim 1, wherein
    the four-pole auxiliary magnet is a ring-shaped magnet that is positioned in parallel to a rotating surface of the rotating magnet.

4. The rotational angle detection device according to claim 3, wherein
    the four-pole auxiliary magnet is coaxially positioned with respect to a rotating shaft of the rotating magnet; and
    the magnetic sensor is positioned in a homogeneous magnetic field of the four-pole auxiliary magnet.

5. The rotational angle detection device according to claim 3, wherein
    the four-pole magnet is positioned on the same surface as a rotating surface of the rotating magnet and in a displaced position with respect to the rotating shaft, and
    the magnetic sensor is positioned in the homogenous magnetic field of the four-pole magnet.

* * * * *